United States Patent
DeBrosse et al.

(10) Patent No.: US 6,490,217 B1
(45) Date of Patent: Dec. 3, 2002

(54) SELECT LINE ARCHITECTURE FOR MAGNETIC RANDOM ACCESS MEMORIES

(75) Inventors: John Kenneth DeBrosse, Colchester, VT (US); William Robert Reohr, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/863,730

(22) Filed: May 23, 2001

(51) Int. Cl.$^7$ .................................................. G11C 7/00
(52) U.S. Cl. ..................... 365/225.5; 365/55; 365/66
(58) Field of Search .............................. 365/225.5, 97, 365/55, 66, 230.03, 171, 173, 232

(56) References Cited

U.S. PATENT DOCUMENTS

| | | | |
|---|---|---|---|
| 6,111,783 A | | 8/2000 | Tran et al. |
| 6,256,224 B1 | * | 7/2001 | Perner et al. ................ 365/173 |
| 6,335,890 B1 | * | 1/2002 | Reohr et al. ............. 365/225.5 |

OTHER PUBLICATIONS

R. Scheuerlein et al., "A 10ns Read and Write Non–Volatile Memory Array Using a Magnetic Tunnel Junction and FET Switch in Each Cell", ISSCC 2000/Session 7/TD: Emerging Memory & Device Technologies/Paper TA 7.2, pp. 128–129, 94–95 and 409.

P.K. Naji et al., "A 256kb 3.0V 1T1MTJ Nonvolatile Magnetoresistive RAM", ISSCC 2001/Session 7/Technology Directions: Advanced Technologies/7.6, pp. 122–123, 94–95 and 404–405.

S. Tehrani et al., "Recent Developments in Magnetic Tunnel Junction MRAM", IEEE Transactions on Magnetics, vol. 36, No. 5, Sep. 2000, pp. 2752–2757.

R.E. Matick, "Open Flux Path, Thin Magnetic Film Devices," Computer Storage Systems and Technology, John Wiley & Sons, pp. 167–187, 1977.

E.C. Stoner, F.R.S. et al., "A Mechanism of Magnetic Hysteresis in Heterogeneous Alloys," vol. 240, A. 826, pp. 599–642, May 4, 1948.

* cited by examiner

*Primary Examiner*—David Lam
(74) *Attorney, Agent, or Firm*—Marian Underweiser; Ryan, Mason & Lewis, LLP

(57) ABSTRACT

A magnetic memory device for selectively writing one or more memory cells in the memory device includes a plurality of global write lines for selectively conveying a destabilizing current, the global write lines being disposed from the memory cells such that the destabilizing current passing through the global write lines does not destabilize unselected memory cells in the memory device, each global write line including a plurality of segmented write lines operatively connected thereto. The memory device further includes a plurality of segmented groups, each segmented group including a plurality of memory cells operatively coupled to a corresponding segmented write line, each segmented write line being disposed in relation to the plurality of corresponding memory cells such that the destabilizing current passing through the segmented write line destabilizes the corresponding memory cells for writing.

28 Claims, 5 Drawing Sheets

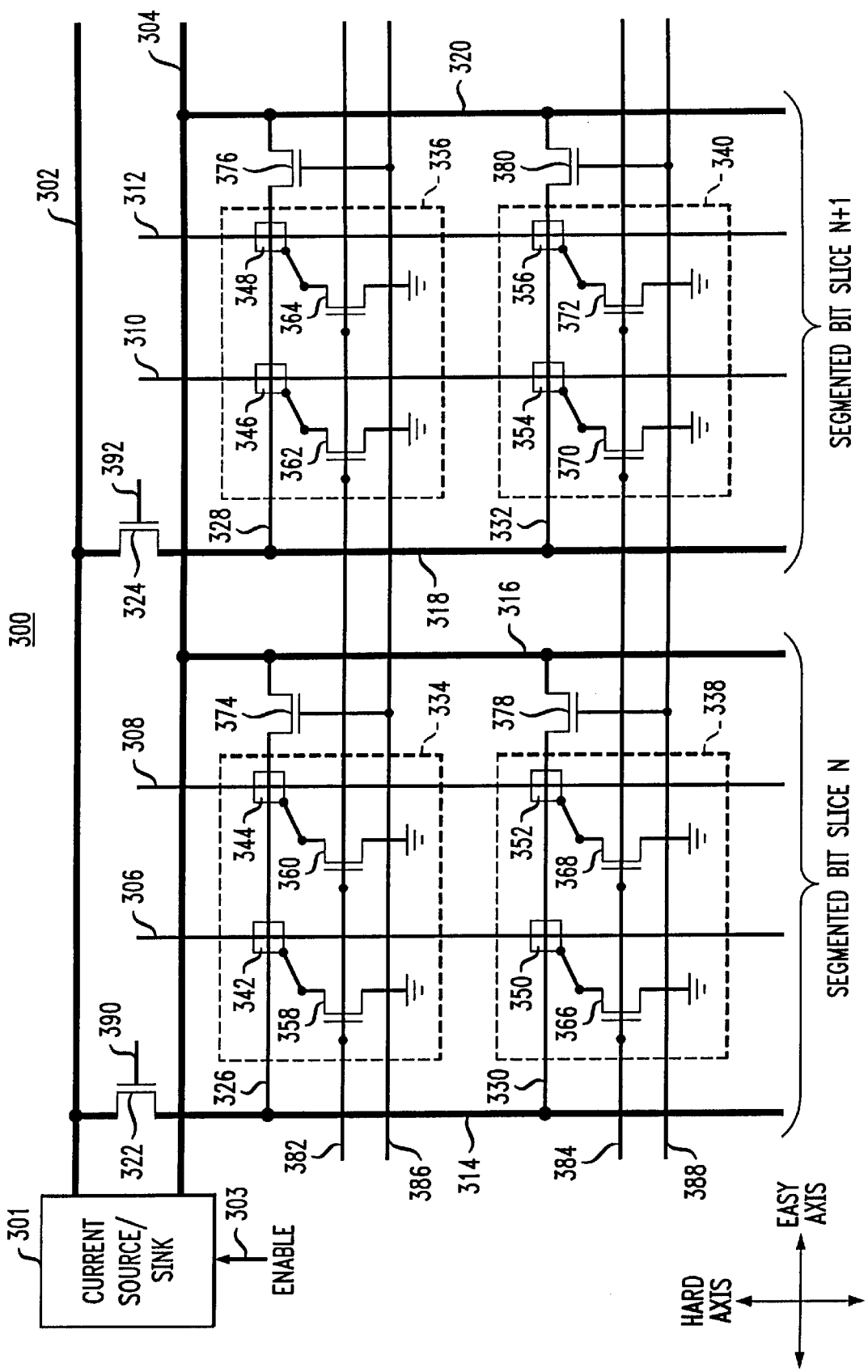

400

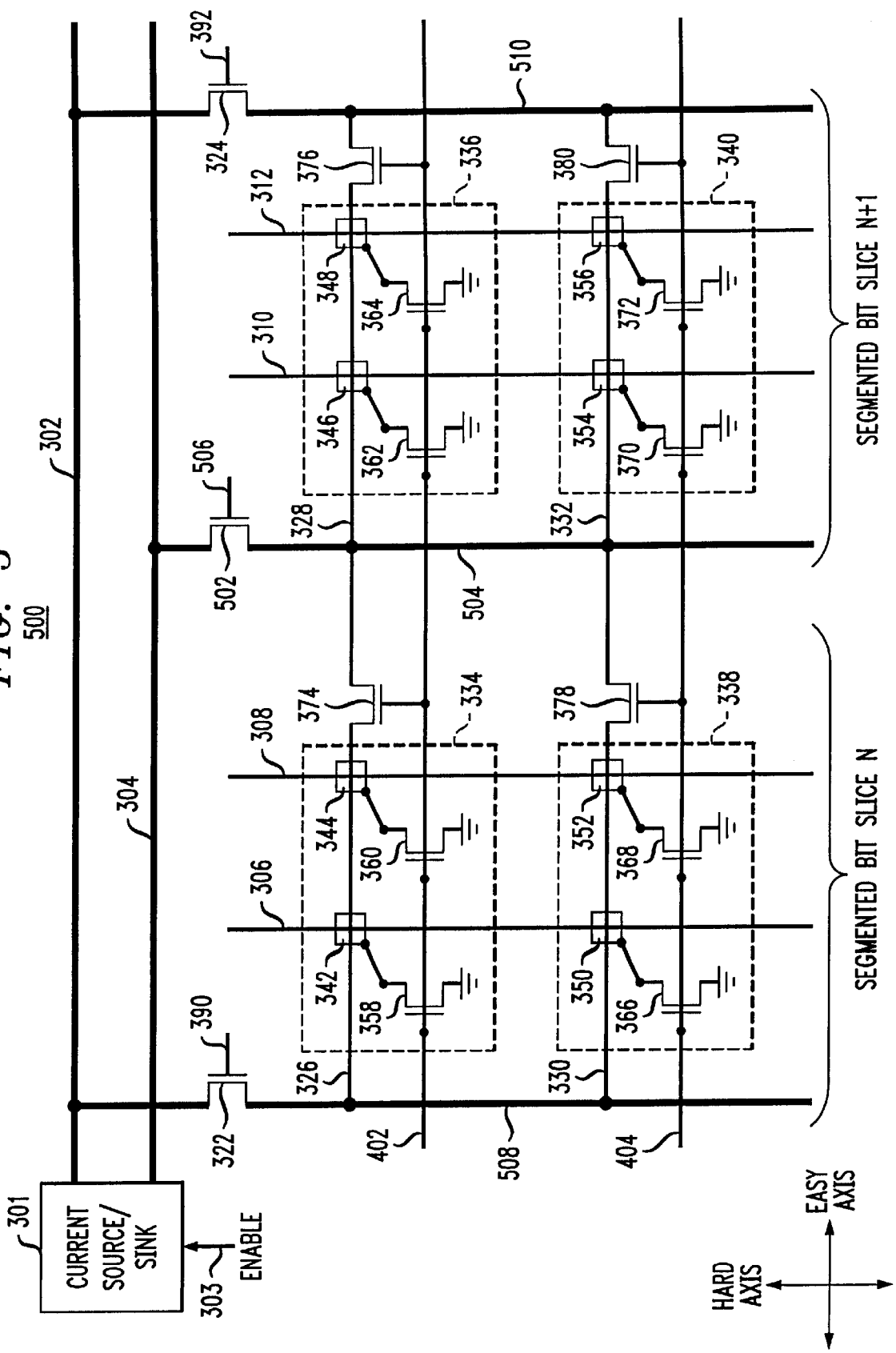

SELECT LINE ARCHITECTURE FOR MAGNETIC RANDOM ACCESS MEMORIES

STATEMENT OF GOVERNMENT RIGHTS

This invention was made with Government support under grant contract number MDA972-99-C-0009 awarded by the Defense Advanced Research Projects Agency (DARPA) of the United States Department of Defense. The Government has certain rights in this invention.

FIELD OF THE INVENTION

The present invention relates generally to random access memory systems, and more particularly relates to an architecture for improving a write margin within a magnetic random access memory (MRAM) device.

BACKGROUND OF THE INVENTION

Thin film magnetic random access memory (MRAM) has been investigated since the early 1950s. However, as described in the text "Computer Storage Systems and Technology," by Richard E. Matick, John Wiley & Sons (1977), which is incorporated herein by reference, these memories were deemed to be impractical due to narrow write and read margins which eroded as device dimensions were scaled. By the early 1970s, semiconductor-based memories, such as dynamic random access memory (DRAM), promised a simpler more compact memory solution than magnetic core memories, the most prevalent random access memory (RAM) available at the time. By the late 1970s, almost all development and production activity related to MRAM had been abandoned.

Recently, a renewed interest in MRAM has been sparked by its application to the nonvolatile memory market. New memory devices, such as a magnetic tunnel junction (MTJ) device, which exhibits magneto resistance, overcame an earlier obstacle of inductive sensing. As summarized in Scheuerlein et al., "A 10ns Read and Write Non-Volatile Memory Array Using a Magnetic Tunnel Junction and FET Switch in Each Cell," *ISSCC* 2000, pp. 128–129, desirable characteristics of MTJ-based memories include high integration density, high speed, low read power, and soft error rate (SER) immunity.

FIG. 1 depicts a conventional MTJ-based MRAM architecture, as described in the aforementioned Scheuerlein et al. paper. Like conventional thin film RAM, MTJ-based MRAM uses an architecture in which memory cells 100 are placed at the cross-points of intersecting write word lines 104 and bit lines 106. Reading of the memory cell 100 is simplified by the inclusion of a field effect transistor (FET) 102 connected to each memory cell for improved isolation. More particularly, a drain terminal of a given FET 102 is coupled to a cell 100, a gate terminal of the given FET 102 is coupled to a corresponding read word line 108, and a source terminal is coupled to ground. In conventional magnetic memory architectures, however, writing individual memory cells without also writing adjacent or other non-intended cells remains a problem.

Typically, writing a memory cell involves passing electrical currents simultaneously through a bit line and word line at the intersection of which an intended MTJ cell resides. The selected MTJ cell will experience a magnetic field which is the vector sum of the magnetic fields created by the word and bit line currents. All other MTJ cell that share the same bit line or word line as the selected MTJ cell will be half-selected and will thus be subjected to either bit line or word line magnetic fields, respectively. Since the magnitude of the vector sum of the word line and bit line fields is about forty-one percent (41%) larger than the individual word line or bit line fields, the selectivity of a selected MTJ cell over half-selected MTJ cells is poor, especially when the non-uniform switching characteristics of the MTJ cells are considered.

Variations in the shape or size of an MTJ cell can give rise to variations in magnetic thresholds of the MTJ cells which are so large that it is virtually impossible to write a selected cell without also arbitrarily switching some of the half-selected cells, thus placing the reliability and validity of the stored data in question. There may also be environmental or other factors, such as temperature and processing variations, that adversely impact the write select margin. Additionally, the spontaneous switching of an MTJ cell when it is subjected to repeated magnetic field excursions much smaller than its nominal switching field, an effect known as "creep," narrows the acceptable write select margin even further thereby making the need for greater selectivity of individual MTJ cells even more imperative.

FIG. 2A graphically depicts the magnetic selectivity of an ideal thin film magnetic memory cell along a hard magnetic axis (e.g., representing the word line field) and an easy magnetic axis (e.g., representing the bit line field), as described, for example, by E. C. Stoner and E. P. Wohlfarth in a paper entitled "A Mechanism of Magnetic Hysteresis in Heterogeneous Alloys," *Royal Society of London Philosophical Transactions*, Ser. A240 (1948), which is incorporated herein by reference. Assuming that the word line and bit line currents generate fields along the hard magnetic axis at point 210 and the easy magnetic axis at point 230, respectively, of the magnetic memory cell, the field ($H_x$, $H_y$) required to switch the magnetic state of the cell must equal or exceed the solid curve or boundary 200. This curve 200, known by those skilled in the art as a switching asteroid, satisfies the relation $H_x^{2/3} + H_y^{2/3} = H_k^{2/3}$, where $H_x$ is the hard axis field, $H_y$ is the easy axis field and $H_k$ is an anisotropy field. A selected cell experiences magnetic fields outside the boundary of the switching asteroid 200 (e.g., corresponding to point 220) which are large enough to write the magnetic cell to a state that aligns with the easy axis field direction. The state of a half-selected cell doesn't change since the magnetic fields acting on it (e.g., corresponding to points 210 and 230) remain within the boundary of the switching asteroid 200.

It is important to consider that, although depicted as a thin fixed boundary line, the switching asteroid 200, in reality, may significantly change shape due to environmental conditions (e.g., temperature) or other factors (e.g., device processing variations). Variations between individual MTJ cells can substantially reduce the write select margin within the overall memory structure. Non-ideal physical characteristics often blur the distinction between half-selected and selected memory cells, wherein the half-selected cells could be written in a write operation intended only for the selected cells.

Hence a major hurdle to the realization of practical sub-micron MRAM architectures has been the problem of write selectivity. There is a need, therefore, in the field of magnetic memory devices and systems for improved write selection techniques which can be readily adapted to the conventional MRAM architecture described above as well as other alternative memory architectures.

SUMMARY OF THE INVENTION

It is an object of the present invention to provide a write architecture for use in a magnetic random access memory (MRAM) device that allows selection of individual memory cells in an array without adversely disturbing neighboring cells in the array and thus increasing the integrity of the data stored therein.

It is another object of the present invention to provide an improved write selection architecture and methodology for MRAM that is compatible with conventional MRAM devices.

It is yet another object of the present invention to provide a write selection architecture for MRAM that utilizes a substantially reduced bit line current, resulting in lower overall system power consumption.

It is a further object of the present invention to provide a write selection architecture for MRAM that has a substantially increased acceptable write disturb margin and is thus less sensitive to magnetic cell mismatches, process variations and other environmental factors within an MRAM array.

Advantageously, the present invention provides an improved write selection architecture and methodology for use with a magnetic memory device that not only allows selection of individual memory cells in an array without adversely disturbing neighboring cells in the array, but also reduces the power consumed in the write operation and the overall sensitivity of the circuit to device mismatches, process variations and other environmental factors.

In accordance with one aspect of the present invention, an improved architecture for selectively writing one or more magnetic memory cells in a magnetic memory device comprises a plurality of global write lines, each global write line including a plurality of segmented write lines connected thereto. The segmented write lines are disposed from the memory cells such that current passing through the global write lines does not substantially disturb unintended or unselected memory cells. The memory device further includes a plurality of segmented groups of memory cells, each segmented group including a plurality of memory cells operatively coupled to a corresponding segmented write line. Each segmented write line is disposed in relation to the memory cells such that a current passing through the segmented write line operatively destabilizes the corresponding memory cells for writing.

The memory device of the present invention further includes at least one segmented group select switch connected between the segmented write line corresponding to the segmented group and a global write line, the group select switch including a group select input for receiving a group select signal. The group select switch completes an electrical circuit between the segmented write line and the global write line in response to the group select signal. Bit lines operatively coupled to the magnetic memory cells are used to selectively write the state of the memory cells.

These and other objects, features and advantages of the present invention will become apparent from the following detailed description of illustrative embodiments thereof, which is to be read in connection with the accompanying drawings, wherein like elements are designated by identical reference numerals throughout the several views.

BRIEF DESCRIPTION OF THE DRAWINGS

FIG. 3 is a schematic diagram illustrating at least a portion of a select line architecture, formed in accordance with one aspect of the present invention.

FIG. 5 is a schematic diagram illustrating an exemplary embodiment of the select line architecture of FIG. 4, formed in accordance with the invention.

DETAILED DESCRIPTION OF PREFERRED EMBODIMENTS

Figure 1:
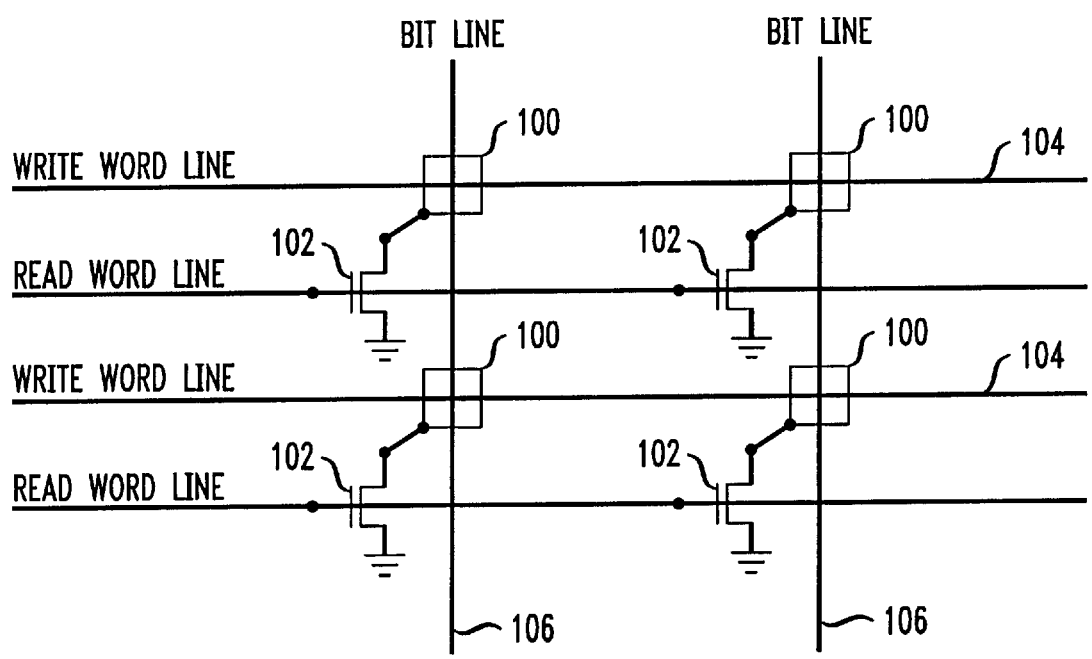
FIG. 1 is a schematic diagram illustrating a conventional MTJ memory array in which field effect transistors (FETs) are connected to corresponding MTJ memory cells.

Commonly owned and co-pending U.S. patent application Ser. No. 09/703,963 entitled "A Segmented Write Line Architecture for Writing Magnetic Random Access Memories," filed Nov. 1, 2000 (IBM Docket No. YOR920000697US1), is incorporated herein by reference.

The present invention will be described herein in the context of an illustrative magnetic random access memory (MRAM) device. It should be appreciated, however, that the present invention is not limited to this or any particular magnetic memory device. Rather, the invention is more generally applicable to any magnetic memory device wherein it is desirable to provide improved write selection techniques. Moreover, although implementations of the present invention are described herein using complementary metal-oxide-semiconductor (CMOS) devices and magnetic tunnel junction (MTJ) devices, it should be appreciated that the invention is not limited to such devices, and that other suitable devices, such as, for example, bipolar junction transistor (BJT) devices and other magneto-resistive memory elements may be similarly employed, with or without modifications to the inventive memory architecture, as will be understood by those skilled in the art.

FIG. 3 illustrates at least a portion of a select line magnetic memory array 300 having an improved write margin, formed in accordance with one aspect of the invention. The illustrative magnetic memory array 300 comprises a plurality of common write lines 302, 304 coupled to a current source/sink 301 for supplying a destabilizing current to selected memory cells in the memory array. The common write lines 302, 304, which may be fabricated of polysilicon gate material or a suitable alternative thereof, are preferably disposed substantially orthogonal to a plurality of bit lines 306, 308, 310, 312 which may also be fabricated of, for example, polysilicon gate material and are used to write the logic state of the memory cells. For simplification, only two common write lines are depicted, although any number of common write lines are contemplated by the present invention. In addition, each of a number of different groups of common write lines may be operatively connected to a corresponding current source/sink. Moreover, the invention contemplates that ground may be used as a current return path, in which case only one common write line may be used.

Each common write line 302, 304 is preferably connected to at least one global write line 314, 316, 318, 320, either indirectly (e.g., through segmented bit slice switches, preferably implemented as field effect transistors (FETs) 322, 324, operatively connected between common write line 302 and global write lines 314, 318, respectively) or directly (e.g., between common write line 304 and global write lines 316, 320). Each global write line is preferably disposed substantially parallel to the bit lines (e.g., 306, 308, 310 and 312), or in a substantially column dimension, and includes a plurality of segmented write lines 326, 328, 330, 332 operatively connected thereto. The segmented write lines 326, 328, 330, 332 are preferably disposed substantially orthogonal to the bit lines 306, 308, 310, 312. Each segmented write line is positioned in close relative proximity to a plurality of memory cells associated therewith such that a current flowing through the segmented write line produces a magnetic field which operatively destabilizes or selects the memory cells for writing. Furthermore, the memory cells are disposed with respect to the common write lines 302, 304 (e.g., on the order of two or three memory cell widths) such that a magnetic field emanating from the common write lines does not disturb or destabilize unintended memory cells.

The illustrative select line architecture of the present invention further comprises a plurality of segmented groups 334, 336, 338 and 340, each segmented group having a plurality of memory cells associated therewith. Each memory cell, as shown in FIG. 3, includes a single magneto-resistive memory element, e.g., 342, 344, 346, 348, 350, 352, 354, 356 which may be implemented as, for example, an MTJ device, and a corresponding switch, e.g., 358, 360, 362, 364, 366, 368, 370, 372, respectively, coupled thereto which may be implemented as a FET device (e.g., n-type or p-type FET) or a suitable alternative thereof. More particularly, a drain terminal of a given FET 358 is coupled to a memory element 342, a gate terminal of the given FET 358 is coupled to a corresponding read word line 382, and a source terminal is coupled to ground. It is to be appreciated that in accordance with the invention a segmented group may include any number of memory cells, although only two memory cells are shown within each segmented group for ease of explanation.

Memory cells comprising any particular segmented group are coupled to a corresponding segmented write line associated with that segmented group either indirectly (e.g., magnetically coupled), as depicted in FIG. 3, or directly. In either case, a current passing through the corresponding segmented write line establishes a magnetic field emanating from the segmented write line, in accordance with conventional electromagnetic principles, which destabilizes all memory cells along the segmented write line for writing.

In order to selectively control the passage of current through the plurality of segmented write lines, the illustrative select line memory array 300 includes a plurality of segmented group select switches 374, 376, 378, 380, each group select switch preferably implemented as a FET device. Each of the group select switches 374, 376, 378, 380 is connected between a corresponding segmented write line 326, 328, 330, 332, respectively, and a current return path or conductor, which may be a global write line 316, 320 as shown in FIG. 3.

The group select switches are responsive to one or more group select signals, operatively coupled thereto, for selectively controlling a current flowing through a particular segmented group (e.g., 334, 336, 338, 340). The one or more group select signals for controlling the group select switches may be generated by peripheral array circuits (not shown), such as, for example, word line drivers or word decoders, via write word lines 386 and 388. A combination of common write lines 302, 304, global write lines 314, 316, 318, 320, and segmented write lines 326, 328, 330, 332, provides a network of conductors over which a destabilizing write current can be selectively routed through a desired segmented group (e.g., 334, 336, 338, or 340).

As shown in FIG. 3, the illustrative memory array 300 is organized as a plurality of segmented bit slices (e.g., segmented bit slice N or segmented bit slice N+1) corresponding to one or more segmented groups along a bit line or column dimension. Current flow within a particular segmented bit slice is selectively controlled via the segmented bit slice switch (e.g., 322 or 324) corresponding to the intended segmented bit slice. As previously discussed, each segmented bit slice switch (e.g., 322 or 324) selectively connects a common write line (e.g., 302) with a corresponding global write line (e.g., 314 or 318, respectively) in response to a bit slice select signal coupled to an input (e.g., 390 or 392, respectively) of the segmented bit slice switch. In this manner, the segmented bit slice switches operatively control which particular segmented bit slice will receive the destabilizing write current. Preferably, only a single segmented bit slice switch is enabled at any given time. However, the present invention similarly contemplates that decode circuitry (not shown) for generating the bit slice select signals may be configured to enable more than one segmented bit slice to be active simultaneously. This may be particularly advantageous, for instance, in applications wherein it is desirable to concurrently write memory cells residing in different segmented bit slices.

Figure 2A:
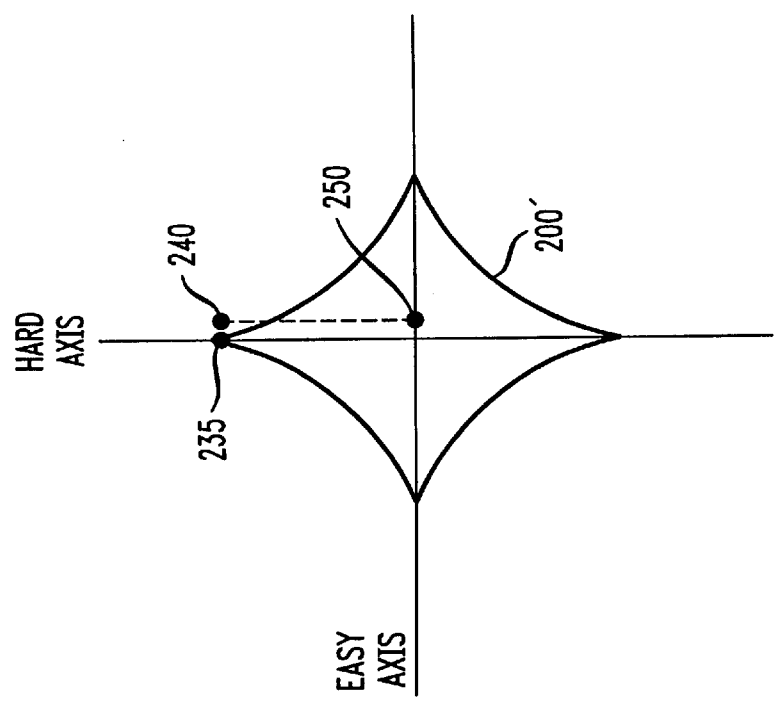
FIG. 2A is a graphical representation illustrating magnetic field points superimposed on a switching asteroid relating to a write operation for a conventional magnetic memory architecture.

As will be appreciated by those skilled in the art, coincident bit and word line currents generate easy and hard axis magnetic fields, respectively. With reference again to FIG. 2A, in order to write a desired magnetic memory cell to a given state, the vector sum of the hard and easy axis fields must first exceed the switching threshold of the memory cell, as illustrated by field point 220 which lies outside the boundary 200 of the switching asteroid. In theory, half-select field points 210 and 230 are within the boundary 200 of the switching asteroid, and hence half-selected memory cells remain in their prior state. However, as previously discussed, process variations and other environmental factors often lead to a degradation in the ideal switching asteroid 200 (and thus reduced write margin), making it probable that at least some half-selected cells using conventional write selection methodologies will inadvertently and arbitrarily switch state.

The illustrative memory architecture of the present invention depicted in FIG. 3 provides a technique for overcoming the limitations of conventional write selection schemes. By way of example only, a write operation directed to a specific segmented group, e.g., 334, will now be described. The illustrative select line memory array 300 directs the application of a destabilizing hard axis magnetic field to a subset of memory cells, namely, those memory cells associated with segmented group 334. All memory elements 342, 344 within the intended segmented group 334 are written simultaneously. Using the architecture of the present invention, and unlike conventional memory architectures, an unselected segmented group (e.g., 336) sharing a common write word line 386 with segmented group 334 does not receive a half-select field along its hard axis, even when the group select switch (e.g., 376) corresponding to the unselected segmented group 336 is enabled. This is primarily due to the fact that only one segmented bit slice among adjacent segmented bit slices, e.g., segmented bit slices N and N+1, can receive a destabilizing write current at any given time. Consequently, the magnitude of the hard axis field can be increased without worry of disturbing the state of an unselected memory cell. Since all memory cells experiencing a hard axis field by definition will be written simultaneously, there are no half-selected memory cells along the word dimension using the select line architecture of the present invention.

Figure 2B:
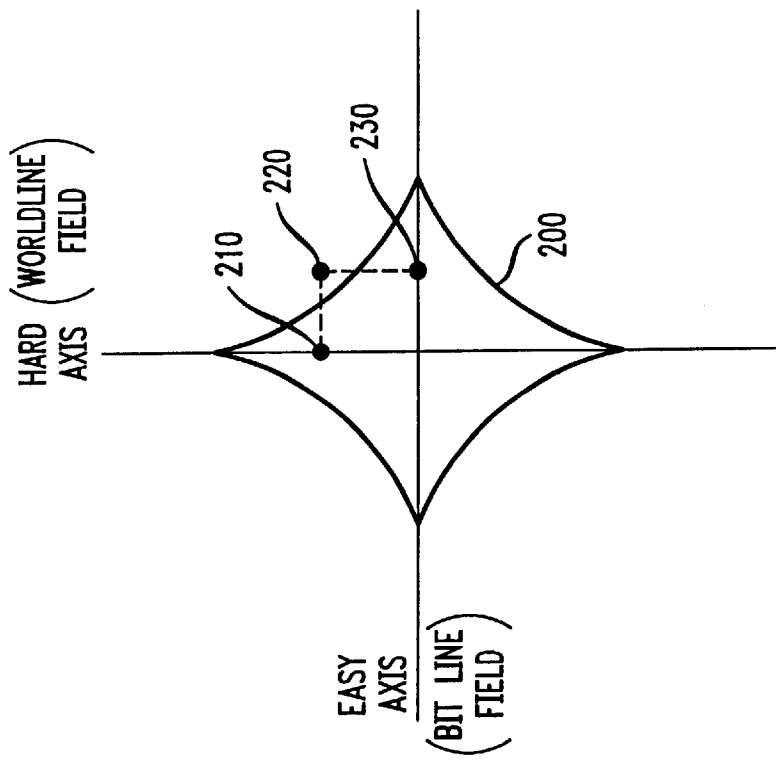
FIG. 2B is a graphical representation illustrating magnetic field points superimposed on a switching asteroid relating to a write operation for a select line architecture, formed in accordance with one aspect of the present invention.

With reference to the illustrative switching asteroid curve depicted in FIG. 2B, field point 240 represents a selected memory cell. With the select line architecture of the invention, the magnitude of the easy axis field (used to write the state of a memory cell) can be substantially decreased, whereby half-selected memory cells represented by field point 250 fall significantly within the boundary 200' of the switching asteroid compared to half-selected memory cells associated with conventional memory write schemes (e.g., represented by field points 210 and 230 in FIG. 2A). In accordance with the present invention, therefore, the write margin between selected and half-selected cells is significantly increased. Moreover, because a large easy axis field is not required by the select line architecture of the invention, the bit line current required to write the memory cells can be significantly reduced, thus reducing the overall write current required by the memory array 300.

Referring again to the illustrative select line architecture of FIG. 3, segmented group 334 is preferably selected for a write operation by enabling bit slice switch 322 along with segmented group select switch 374, preferably with a logic high bit slice select signal presented to the bit slice select input 390 and a logic high signal applied to the write word line 386, respectively, assuming the select switches are implemented using n-type FET devices, or a suitable alternative thereof. All other write switches, bit slice switches and segmented group select switches not associated with the selected segmented group 334 are preferably disabled by applying, for example, logic low signals to the respective bit slice switch (e.g., switch 324) and to write word line 388, again assuming n-type FET devices are employed for the select switches. Alternatively, the present invention similarly contemplates that select signals having an opposite polarity (e.g., active low to enable) may be used when implementing the select switches using, e.g., p-type FET devices. In either case, signals for selectively enabling/disabling the appropriate select switches in the memory array 300 may be generated by conventional bit and word decode circuitry (not shown), as will be understood by those skilled in the art.

The common write lines 302, 304 are preferably operatively connected to the current source/sink 301, as stated previously, and are used essentially as a bus to carry the destabilizing write line current. Because the common write lines are preferably disposed away from the memory cells, they can be made wider compared to, for example, global and segmented write lines. Moreover, because the resistance of a conductor is inversely proportional to its width, the wider common write lines will exhibit a much lower resistance, and hence smaller voltage drop, compared to the global and segmented write lines.

The destabilizing current is preferably generated by the current source/sink 301, which may either reside within the memory array 300 (e.g., local) or may be external to the memory array (e.g., global). Preferably, the current source/sink 301 is activated in response to an enable signal 303 coupled thereto. It should also be appreciated that the current sink portion of element 301 may be, for example, ground or a negative voltage supply, in which case the common write line (e.g., 304), along with one or more predetermined return global write line connections (e.g., 316, 320), may be omitted. The present invention also contemplates that each segmented bit slice may include its own current source/sink circuitry (not shown) for locally generating the destabilizing write line current. Using this localized current source/sink approach, the common write lines 302, 304, as well as the bit slice select switches, e.g., 322, 324, may be omitted and the global write lines, e.g., 314, 316 and 318, 320 coupled directly to a corresponding local current source/sink. Enable signals for activating a corresponding local current source/sink may be generated by separate decode circuitry (not shown), whereby no two adjacent segmented bit slices receive destabilizing current simultaneously.

By way of example only, after enabling the current source/sink 301 with an active enable signal 303 applied thereto, the destabilizing current flows through common write line 302, and through bit slice switch 322, which is operatively connected to the common write line 302, in response to an active bit slice select signal applied to bit slice select input 390. When the segmented group select switch 374 corresponding to intended segmented group 334 is enabled (e.g., with a logic high signal on write word line 386), the destabilizing current preferably traverses through global write line 314, through segmented write line 326, then through group select switch 374, through global write line 316, and finally through common write line 304, where the destabilizing current is returned to the current source/sink 301. As noted above, although shown in FIG. 3 as including a single current source/sink 301, the invention contemplates that separate current source and current sink circuitry may be similarly employed. It is to be appreciated that only a unidirectional current flow is required to produce a hard axis magnetic field in order to destabilize the magnetic memory elements 342, 344. The destabilized memory elements 342, 344 are then preferably written independently to a logic one or logic zero state by respective coincident easy axis magnetic fields that drive the magnetic moment of the memory elements, thus establishing the binary state of the cell.

As previous explained, word and bit decode logic preferably selects a particular segmented group to be written. Decode circuitry suitable for use with the present invention is described, for example, in the above-cited commonly owned and co-pending patent application Ser. No. 09/703,963. Individually decoded bit slice control lines (not shown) may be connected to the bit slice select inputs 390, 392 of the bit slice select switches 322, 324, respectively, for selectively enabling a particular segmented bit slice N or N+1, respectively.

Bit lines 306, 308, associated with the selected segmented group 334, preferably conduct a bidirectional current in order to write the memory elements 342, 344, respectively, to one of two valid states. During a write operation, the direction of the current within the individual bit lines determines the data state to be stored within each memory element. While other memory elements, e.g., 350, 352, also receive an easy axis field emanating from bit lines 306, 308, respectively, and may thus be considered half-selected, these memory elements will not switch state because they are not destabilized by a hard axis field. Additionally, because the hard axis field can be significantly increased using the select line architecture of the invention, the easy axis field can be significantly reduced, thus memory elements along the same bit line will not even receive a large enough field to become half-selected.

It is to be appreciated that, since the switching asteroid (e.g., defined by boundary 200' in FIG. 2B) associated with a magnetic memory element is essentially symmetrical about its easy axis origin, the direction of the destabilizing current, and hence the direction of the hard axis field resulting therefrom, is not important. Rather, it is the magnitude of the destabilizing current that is critical for destabilizing the magnetic memory element. A substantially equal but opposite hard axis field accomplishes the same write selection function. Therefore, while only one direction of the destabilizing current has been described herein, it is similarly contemplated by the present invention that the direction of destabilizing current flow may be reversed.

Figure 4:
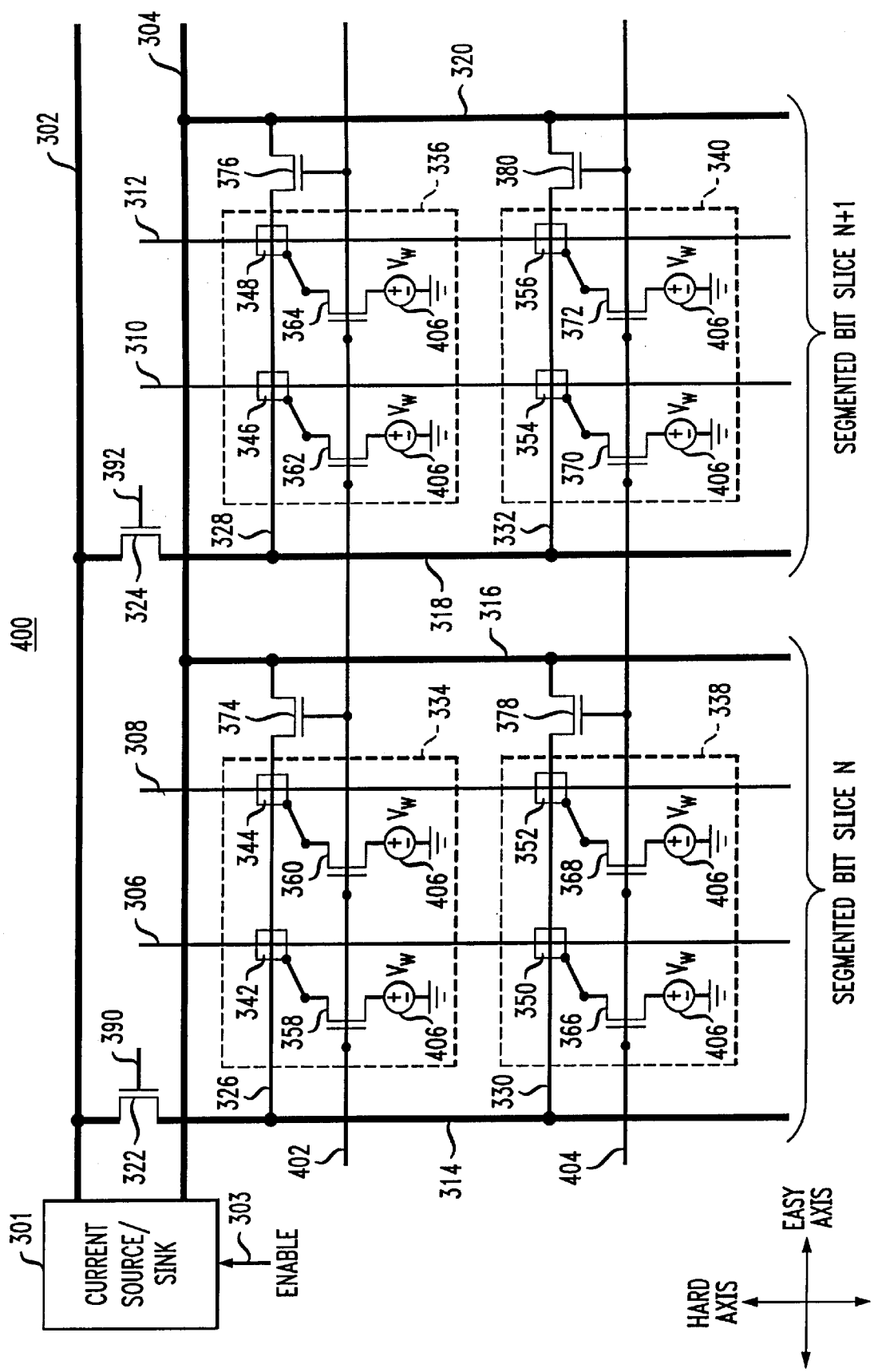
FIG. 4 is a schematic diagram illustrating the select line architecture of FIG. 3, modified to provide a single read/write word line, in accordance with the invention.

FIG. 4 depicts at least a portion of a select line memory array 400, formed in accordance with another aspect of the present invention. The memory array 400 shown in FIG. 4 is consistent with the memory array 300 of FIG. 3, except that the write word lines (e.g., 386, 388) and corresponding read word lines (e.g., 382, 384, respectively) are combined into single read/write word lines 402, 404, respectively, which may be fabricated of polysilicon gate material or a suitable alternative thereof. The memory array 400 provides important advantages, for example, where it is desirable to reduce, at least in part, wiring congestion and yield a more compact physical implementation of a memory array incorporating such unique architecture. In order for the combined read/white word line architecture of FIG. 4 to properly function, it is to be appreciated that each memory cell comprises a switch, preferably implemented as a FET device (e.g., 358, 360, 362, 364, 366, 368, 370, 372) embedded within the memory cell, operatively coupled to a corresponding magneto-resistive memory element, preferably implemented as an MTJ device (e.g., 342, 344, 346, 348, 350, 352, 354, 356). The illustrative memory array 400 further includes a plurality of adaptive voltage sources 406. Each memory cell preferably includes its own adaptive voltage source 406 operatively coupled in series with the corresponding magnetic memory element. More particularly, the adaptive voltage source 406 is preferably connected in series between the source terminal of a FET, e.g., 358, and ground. The adaptive voltage source 406, at least in part, preferably increases an overall reliability of the magnetic memory element, as will be discussed herein below.

By way of example only, assuming the switches throughout the illustrative select line memory array 400 are implemented using n-type FET devices, a logic high signal passing along a read/write word line 402 or 404 (which may be fabricated of polysilicon gate material) defines an active row of memory cells in the memory array, comprising segmented groups 334, 336 or 338, 340, respectively, for example, by completing an electrical circuit path from the current source/sink 301 via common write line 302 and returning to the current source/sink 301 via common write line 304. A particular segmented group, e.g., 334 or 336, within an active row may be selected for a read operation and a write operation by applying an active high signal on the read/write word line 402, although only one of a read or a write operation may be performed within any one segmented group at any given time. With regard to segmented groups 334 and 336, switches 358 and 360, or 362 and 364, respectively, are associated with the read operation, and a segmented group select switch 374 or 376, respectively, is associated with the write operation. Similarly, a logic high signal applied to a particular bit slice select switch, e.g., 322 or 324, defines an active column of memory cells in the select line memory array 400, thus operatively directing the write selection to a single segmented bit slice (e.g., segmented bit slice N, corresponding to segmented groups 334, 338, or segmented bit slice N+1, corresponding to segmented groups 336, 340, respectively).

If each segmented bit slice includes its own local current source/sink, as discussed above, the present invention contemplates that multiple segmented groups (e.g., 334 and 336) along the same read/write word line, e.g., 402, may be written simultaneously. Likewise, multiple read operations, or a combination of read and write operations, on segmented groups residing in different segmented bit slices along the same read/write word line can be simultaneously performed along a given read/write word line.

With continued reference to FIG. 4, in order to write a particular segmented group, e.g., 340, read/write word line 404 and bit slice select input 392 of bit slice select switch 324 are driven to a logic high (i.e., enabled), while read/write word line 402 and bit slice select input 390 of bit slice select switch 322 are concurrently driven to a logic low (i.e., disabled). A complete electrical circuit is thereby established, with current sourced from current source/sink 301 along common write line 302 and subsequently returned to current source/sink 301 along common write line 304. The conductive path in this example, therefore, comprises common write line 302, bit slice select switch 324, global write line 318, segmented write line 332, segmented group select switch 380, global write line 320, and finally common write line 304.

As noted above, each memory cell in the illustrative memory array 400 depicted in FIG. 4 includes the corresponding adaptive voltage source 406. Alternatively, the adaptive voltage source 406, rather than being embedded within each memory cell may instead reside external to the memory cell. Furthermore, the adaptive voltage source 406 may be a single source shared by more than one memory cell. The adaptive voltage sources 406 preferably provide a predetermined voltage drop during a write operation and provide a substantially zero voltage drop (i.e., shunt) during a read operation on the corresponding memory cell. The adaptive voltage source 406 may be implemented, for example, as a diode connected in parallel with a shunt device, or a suitable alternative thereof, operatively controlled, for example, by read/write decode circuitry (not shown). The inclusion of the adaptive voltage source 406 in the illustrative memory array 400 provides at least one important benefit, namely, solving a potential reliability issue inherent in the memory cell structure.

More specifically, during either a read or a write operation, each magneto-resistive memory element, e.g., 342, 344, 346, 348, 350, 352, 354, 356 is connected, via a switch preferably implemented as a FET device, e.g., 358, 360, 362, 364, 366, 368, 370, 372, respectively, to adaptive voltage source 406 rather than to ground or a suitable alternative thereof. Without the adaptive voltage source 406, excessive voltage can potentially build up across the memory element during a write operation. To avoid this, each adaptive voltage source 406 is set to a predetermined voltage, Vw, preferably in conjunction with the mean bit line voltage, to minimize the voltage drop across the memory element and thereby prevent damage resulting from high electric fields or currents. During a read operation, the voltage of the adaptive voltage source 406 is set to zero, or another designated voltage, depending on the requirements of a sense amplifier (not shown) operatively coupled to the memory cell for determining the state of the cell.

With reference now to FIG. 5, at least a portion of a select line memory array 500 is shown, formed in accordance with another aspect of the invention. The select line memory array 500 is modified compared to the memory architecture depicted in FIG. 4. Specifically, global write lines (e.g., 316 and 320 in FIG. 4) returning the destabilizing current from selected memory cells residing in adjacent segmented bit slices N and N+1, respectively, are combined to form a single shared global write line 504. It is to be appreciated that in a multiple segmented bit slice arrangement, each global write line, e.g., 508, 510, which supplies the destabilizing current to a corresponding segmented group, would be preferably combined with the global write line in an adjacent segmented bit slice in a manner consistent with shared global write line 504. The shared global write line 504 is operatively coupled to a common write line, e.g., 304, through a bit slice select switch 502 which is responsive to a corresponding bit slice select signal applied to a bit slice select input 506 of the bit slice select switch 502. It is to be appreciated that the bit slice select signals may be generated by decode circuitry (not shown), whereby adjacent pairs of bit slice select switches (e.g., 322, 502 or 324, 502) are simultaneously activated at any particular time to select a corresponding segmented bit slice. In this manner, the illustrative memory array 500 preferably provides control of both the global write lines supplying and returning the destabilizing current from current source/sink 301.

Although the destabilizing current will now pass by the memory elements 346, 348 and 354, 356 in an opposite direction compared to FIG. 4, there will be virtually no effect on the write selection operation of the memory cells since the direction of the hard axis field is not important for destabilizing the memory cells, as previously stated herein. Furthermore, in the memory array 500 it is assumed without limitation that the memory elements (e.g., 342, 344, 346, 348, 350, 352, 354, 356) within the individual memory cells are able to tolerate the voltage drop across them induced during a write operation without sustaining damage to the memory elements. Consequently, the adaptive voltage sources (e.g., 406) shown in FIG. 4 have been omitted in the FIG. 5 embodiment.

The select line memory array 500 operates in a manner consistent with that previously described in conjunction with the memory array of FIG. 4. Specifically, by way of example only, a write selection operation directed to a particular segmented group, e.g., 334, will now be described with reference to FIG. 5. As noted previously, the illustrative select line memory architecture of the invention operatively directs the application of a hard axis magnetic field to a subset of memory cells, namely, in this example, those memory cells associated with segmented group 334. All memory elements 342, 344 within segmented group 334 are written simultaneously by the coincidence of hard and easy axis fields generated by currents flowing through segmented write line 326 and bit lines 306 and 308, respectively. Unlike conventional magnetic memory architectures, unselected memory cells (e.g., within segmented group 336) sharing the same read/write word line (e.g., 402) with a selected segmented group (e.g., 334) do not receive a half-select field along their hard axis since only one segmented bit slice among adjacent bit slices is active, e.g., via bit slice select switches 322, 324. Shared segmented bit slice switch 502 remains active if either segmented bit slice N or segmented bit slice N+1 is selected, for returning the destabilizing write current carried along shared global write line 504 to common write line 304. In this manner, the write operation avoids unintended half-selected cells along the word dimension.

With continued reference to FIG. 5, assuming without limitation that all switches in the memory array 500 are implemented using n-type FET devices, segmented group 334 is selected for a write operation by enabling adjacent bit slice switches 322 and 502 with a logic high signal applied to the respective bit slice select inputs 390 and 506, and by enabling group select switch 374 by applying a logic high signal on read/write word line 402. All other switches, including bit slice switch 324 and group select switches 378 and 380, are disabled by applying a logic low signal on bit slice select input 392 and on read/write word line 404, respectively. Although segmented group select switch 376 will also be enabled since it shares the same read/write word line 402 as group select switch 374, segmented group 336 will not receive the destabilizing current since bit slice switch 324 is disabled. As previously stated, select high and low signals are preferably generated via standard bit and word decode logic (not shown).

After enabling the current source/sink 301 by applying an active enable signal 303 thereto, the destabilizing current operatively flows through a network of conductive paths comprising common write line 302, bit slice switch 322, global write line 508, segmented write line 326, group select switch 374, shared global write line 504, bit slice switch 502, and finally common write line 304, where the destabilizing current returns to the current source/sink 301. As described herein above, only a unidirectional current flowing through the conductive network is required to produce a hard axis magnetic field which destabilizes the memory elements 342 and 344. These destabilized memory elements are written independently to a one or zero state by coincident easy axis magnetic fields, wherein field lines are directed along the easy axis (horizontal axis) and point either to the right or left. Bit lines 306 and 308 conduct bidirectional currents. The direction of the current along each bit line determines the data state to be stored within the corresponding memory element.

It is to be appreciated that when implementing the select line memory architecture of the present invention, the common and/or global write lines are separated by a predetermined distance from the memory cells, some more than others. As previously discussed, this isolation is essential in order to prevent or at least substantially reduce undesirable stray electromagnetic fields emanating from the common and/or global write lines from coupling into the memory cells. These stray magnetic fields can undesirably effect the integrity of the data stored in the magnetic memory cells. As understood by those skilled in the art, the magnetic field strength of a wire conductor decays as the inverse of the radial distance outward from the conductor. Electromagnetic isolation is therefore achieved by adequately spacing one group of memory cells from the conductor(s) used to write another group of memory cells. Of course, this spacing will primarily depend upon the characteristics of the magnetic memory element itself, defined, at least in part, by the switching asteroid for the particular element, as previously discussed above. A desired spacing reflects a balance between adequate isolation between memory cells and a compact physical structure of the memory device.

Another aspect of electromagnetic isolation relates to the direction of the applied magnetic fields, for example, whether the applied fields are primarily in-plane or out-of-plane. With reference to FIG. 5, bit lines 306, 308, 310, 312 and segmented write lines 326, 328, 330, 332 will emanate radial magnetic fields which are primarily directed in-plane with respect to the memory elements 342, 344, 346, 348, 350, 352, 354, 356. Global write lines 508, 504, 510 will alternatively generate radial magnetic fields that are primarily directed out-of-plane, although a small component of the magnetic field will be directed along the easy axis of the neighboring memory cells. In-plane fields switch magnetic elements according to the manner prescribed previously with respect to the switching curves shown in FIG. 2A and FIG. 2B. In this case, the total anisotropic switching field, $H_k$, need only be around 100 Orstead, whereas a magnetic field strength in excess of one Tesla is required to point the magnetic domains of the memory elements out-of-plane.

Accordingly, relatively good isolation can be achieved by spacing the global write lines from a given memory element by a distance on the order of a few memory cell widths.

It is to be appreciated that a memory device may operatively incorporate the select line architecture thus described with peripheral circuitry, including, for example, one or more current drivers, bit and/or word line decoders and interface circuitry, in accordance with the invention. Furthermore, a memory system may be fabricated in accordance with the invention which comprises a plurality of such memory devices, each of the memory devices employing the select line memory architecture described herein. The memory system may further include conventional memory devices, peripheral and/or interface circuitry, operatively connected to provide at least a portion of the object, features and advantages of the invention previously discussed.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the present invention.

What is claimed is:

1. A magnetic memory device for selectively writing one or more memory cells therein, each of at least a portion of the memory cells including at least one transistor operatively coupled to a magneto-resistive memory element, the magnetic memory device comprising:
    a plurality of global write lines for selectively conveying a destabilizing current, the global write lines being disposed from the memory cells such that the destabilizing current passing through the global write lines does not substantially disturb unselected memory cells in the memory device, each global write line including a plurality of segmented write lines operatively connected thereto;
    a plurality of segmented groups of memory cells, each segmented group including a plurality of memory cells operatively coupled to a corresponding segmented write line, each segmented write line being disposed in relation to the plurality of corresponding memory cells such that the destabilizing current passing through the segmented write line destabilizes the corresponding memory cells for writing;
    a plurality of segmented group select switches, each group select switch being operatively connected between a corresponding segmented write line and a global write line, the group select switch including a group select input for receiving a group select signal, the group select switch completing an electrical circuit between the corresponding segmented write line and the global write line in response to the group select signal;
    a plurality of bit lines operatively coupled to each of the memory cells for selectively writing a state of the memory cells; and
    a plurality of read/write word lines, at least a portion of the read/write word lines being operatively coupled to the at least one transistor in one or more corresponding memory cells and one or more segmented group select switches corresponding thereto in a substantially word dimension.

2. The device of claim 1, further comprising at least one common write line for supplying the destabilizing current to one or more memory cells in the memory device, the common write line being disposed from the memory cells such that the destabilizing current passing through the common write line does not substantially disturb unselected memory cells in the memory device.

3. The device of claim 2, further comprising a plurality of segmented bit slice switches operatively connected between the common write line and at least one global write line corresponding to a segmented bit slice, each segmented bit slice switch including a bit slice select input for receiving a bit slice select signal and completing an electrical circuit between the common write line and the at least one global write line in response to the bit slice select signal.

4. The device of claim 2, wherein the at least one common write line is disposed substantially parallel to the plurality of segmented write lines.

5. The device of claim 1, wherein the plurality of global write lines are disposed substantially orthogonal to the segmented write lines.

6. The device of claim 1, wherein the magneto-resistive memory element is a magnetic tunnel junction (MTJ) device.

7. The device of claim 1, wherein each of the memory cells is operatively coupled to at least one adaptive voltage source, the adaptive voltage source providing a first predetermined voltage drop during a write operation of the memory cells and a second predetermined voltage drop during a read operation of the memory cells.

8. The device of claim 7, wherein the second predetermined voltage drop is substantially zero.

9. The device of claim 1, further comprising:
    at least one decoder operatively configured to concurrently perform at least one of reading and writing multiple segmented groups of memory cells, each of the segmented groups corresponding to a same write word line and residing in different segmented bit slices in the memory device.

10. The device of claim 1, further comprising:
    at least one current source operatively coupled the global write lines, the current source operatively supplying the destabilizing current to selected memory cells in the memory device.

11. The device of claim 1, wherein two or more global write lines corresponding to different segmented bit slices are operatively combined to form a shared global write line.

12. The device of claim 1, wherein at least a portion of the plurality of global write lines are configured to convey the destabilizing current to at least two segmented groups of memory cells substantially concurrently.

13. The device of claim 1, wherein at least a portion of the read/write word lines are operatively coupled to the at least one transistor in one or more corresponding memory cells and one or more segmented group select switches corresponding thereto in a substantially bit dimension.

14. A memory system comprising:
    a plurality of magnetic memory devices, at least one of the magnetic memory devices including:
        a plurality of memory cells, each of at least a portion of the memory cells including at least one transistor operatively coupled to a magneto-resistive memory element;
        a plurality of global write lines for selectively conveying a destabilizing current, the global write lines being disposed from the memory cells such that the destabilizing current passing through the global write lines does not substantially disturb unselected memory cells in the memory device, each global write line including a plurality of segmented write lines operatively connected thereto;

a plurality of segmented groups of memory cells, each segmented group including a plurality of memory cells operatively coupled to a corresponding segmented write line, each segmented write line being disposed in relation to the plurality of corresponding memory cells such that the destabilizing current passing through the segmented write line destabilizes the corresponding memory cells for writing;

a plurality of segmented group select switches, each group select switch being operatively connected between a corresponding segmented write line and a global write line, the group select switch including a group select input for receiving a group select signal, the group select switch completing an electrical circuit between the corresponding segmented write line and the global write line in response to the group select signal;

a plurality of bit lines operatively coupled to each of the memory cells for selectively writing a state of the memory cells; and a plurality of read/write word lines, at least a portion of the read/write word lines being operatively coupled to one or more segmented group select switches and corresponding memory cells in the at least one magnetic memory device in a substantially word dimension; and a decoder operatively coupled to the memory devices for selectively performing at least one of reading and writing one or more memory cells in the memory system.

15. The system of claim 14, further comprising at least one common write line for supplying the destabilizing current to one or more memory cells in the at least one magnetic memory device, the common write line being disposed from the memory cells such that the destabilizing current passing through the common write line does not substantially disturb unselected memory cells in the memory device.

16. The system of claim 15, wherein the at least one magnetic memory device further comprises a plurality of segmented bit slice switches operatively connected between the common write line and at least one global write line corresponding to a segmented bit slice, each segmented bit slice switch including a bit slice select input for receiving a bit slice select signal and completing an electrical circuit between the common write line and the at least one global write line in response to the bit slice select signal.

17. The system of claim 15, wherein the at least one common write line is disposed substantially parallel to the plurality of segmented write lines.

18. The system of claim 14, wherein the plurality of global write lines in the at least one magnetic memory device are disposed substantially orthogonal to the segmented write lines.

19. The system of claim 14, wherein the magneto-resistive memory element is a magnetic tunnel junction (MTJ) device.

20. The system of claim 14, wherein each of the memory cells is operatively coupled to at least one adaptive voltage source, the adaptive voltage source providing a first predetermined voltage drop during a write operation of the memory cells and a second predetermined voltage drop during a read operation of the memory cells.

21. The system of claim 14, wherein the decoder is operatively configured to concurrently perform at least one of reading and writing multiple segmented groups of memory cells in the at least one magnetic memory device, each of the segmented groups corresponding to a same write word line and residing in different segmented bit slices in the at least one magnetic memory device.

22. The system of claim 14, wherein two or more global write lines corresponding to different segmented bit slices are operatively combined to form a shared global write line.

23. The system of claim 14, wherein at least a portion of the plurality of global write lines are configured to convey the destabilizing current to at least two segmented groups of memory cells.

24. The system of claim 14, wherein at least a portion of the read/write word lines are operatively coupled to one or more segmented group select switches and corresponding memory cells in the at least one magnetic memory device in a substantially bit dimension.

25. In a magnetic memory device comprising a plurality of memory cells, each of at least a portion of the memory cells including at least one transistor operatively coupled to a magneto-resistive memory element, a method for selectively writing one or more magnetic memory cells comprising the steps of:

generating a destabilizing current, the destabilizing current being conveyed to selected memory cells in the memory device via a plurality of global write lines, the global write lines being disposed from the memory cells such that the destabilizing current passing through the global write lines does not substantially disturb unselected memory cells in the memory device, each global write line including a plurality of segmented write lines operatively connected thereto;

generating a write current for writing a state of the selected memory cells, the write current being conveyed via a plurality of bit lines operatively coupled to the memory cells;

selecting a segmented group of memory cells for writing via a corresponding read/write word line, the segmented group including a segmented group select switch corresponding thereto and a plurality of memory cells operatively coupled to a corresponding segmented write line, the read/write word line being operatively coupled to the at least one transistor in the memory cells associated with the selected segmented group and the corresponding segmented group select switch; and directing the write current through the bit lines, whereby each of the selected memory cells stores one of a first logic state corresponding to a first direction of the write current and a second logic state corresponding to a second direction of the write current.

26. The method of claim 25, wherein the step of selecting the segmented group of memory cells comprises the step of:

directing the destabilizing current through the segmented write line corresponding to the selected segmented group of memory cells, the segmented write line being disposed in relation to the corresponding memory cells such that the destabilizing current passing through the segmented write line destabilizes the corresponding memory cells for writing.

27. The method of claim 25, further comprising the step of:

concurrently performing at least one of reading and writing multiple segmented groups of memory cells in the memory device, each of the segmented groups corresponding to a same write word line and residing in different segmented bit slices in the memory device.

28. The method of claim 25, further comprising the step of combining two or more global write lines corresponding to different segmented bit slices to form a shared global write line, the shared global write line conveying the destabilizing current to at least two segmented groups of memory cells.

* * * * *